(12) United States Patent
Hughes et al.

(10) Patent No.: US 11,882,767 B2
(45) Date of Patent: Jan. 23, 2024

(54) FORMATION OF PIEZOELECTRIC DEVICES

(71) Applicant: Novosound Ltd., Newhouse (GB)

(72) Inventors: David Hughes, Newhouse (GB); Desmond Gibson, Newhouse (GB); Daniel Irving, Newhouse (GB)

(73) Assignee: Novosound Ltd., Newhouse (GB)

(*) Notice: Subject to any disclaimer, the term of this patent is extended or adjusted under 35 U.S.C. 154(b) by 591 days.

(21) Appl. No.: 16/976,142

(22) PCT Filed: Feb. 27, 2019

(86) PCT No.: PCT/GB2019/050549
§ 371 (c)(1),
(2) Date: Aug. 27, 2020

(87) PCT Pub. No.: WO2019/166805
PCT Pub. Date: Sep. 6, 2019

(65) Prior Publication Data
US 2020/0411750 A1 Dec. 31, 2020

(30) Foreign Application Priority Data

Feb. 28, 2018 (GB) ..................................... 1803257

(51) Int. Cl.
*H10N 30/074* (2023.01)
*H10N 30/082* (2023.01)
(Continued)

(52) U.S. Cl.
CPC ......... *H10N 30/074* (2023.02); *H10N 30/082* (2023.02); *H10N 30/10513* (2023.02); *H10N 30/853* (2023.02); *H10N 30/87* (2023.02)

(58) Field of Classification Search
CPC ........... H10N 30/853; H10N 30/10513; H10N 30/082; H10N 30/87; H10N 30/074
See application file for complete search history.

(56) References Cited

U.S. PATENT DOCUMENTS

| | | | |
|---|---|---|---|
| 4,156,050 A | 5/1979 | Ogawa et al. | |
| 4,164,676 A * | 8/1979 | Nishiyama | H10N 30/853 |
| | | | 204/192.18 |

(Continued)

FOREIGN PATENT DOCUMENTS

| | | |
|---|---|---|
| CN | 101118948 A | 2/2008 |
| CN | 102163687 A | 8/2011 |

(Continued)

OTHER PUBLICATIONS

Search Report for Application No. GB 1803257.3 dated Jun. 27, 2018.

(Continued)

*Primary Examiner* — J. San Martin
(74) *Attorney, Agent, or Firm* — Patterson + Sheridan, LLP

(57) ABSTRACT

A method for producing an ultrasonic transducer or ultrasonic transducer array, the method comprising providing or depositing a layer of piezoelectric material on a substrate. The piezoelectric material is a doped, co-deposited or alloyed piezoelectric material. The piezoelectric material comprises: a doped, co-deposited or alloyed metal oxide or metal nitride, the metal oxide or metal nitride being doped, co-deposited or alloyed with vanadium or a compound thereof; or zinc oxide doped, co-deposited or alloyed with a transition metal or a compound thereof. Optionally, the deposition of the layer of piezoelectric material is by sputter coating, e.g. using a sputtering target that comprises a doped or alloyed piezoelectric material. In examples, the layer of piezoelectric material is deposited onto the substrate using high power impulse magnetron sputtering (HIPIMS). Further enhancement may be obtained using substrate biasing (e.g. DC and/or RF) during deposition of the layer of piezoelectric material. In further examples, the substrate is (Continued)

provided on a rotating drum whilst tire layer of piezoelectric material is being deposited.

17 Claims, 4 Drawing Sheets

(51) Int. Cl.
    *H10N 30/87*     (2023.01)
    *H10N 30/853*     (2023.01)
    *H10N 30/00*     (2023.01)

(56) References Cited

U.S. PATENT DOCUMENTS

2014/0292941 A1   10/2014  Kobayashi et al.
2015/0044386 A1    2/2015  Vilkomerson et al.

FOREIGN PATENT DOCUMENTS

| | | | | |
|---|---|---|---|---|
| CN | 108231998 A | * | 6/2018 | ............. H01L 41/18 |
| EP | 1396889 A2 | | 3/2004 | |
| EP | 3216894 A1 | | 9/2017 | |
| GB | 2555835 A | | 5/2018 | |
| JP | 2005089229 A | | 4/2005 | |
| JP | 2011080132 A | | 4/2011 | |
| JP | 2017117981 A | | 6/2017 | |

OTHER PUBLICATIONS

Examination Report for Application No. GB 1803257.3 dated Dec. 23, 2019.
International Preliminary Report on Patentability ffrom PCT/GB2019/050549 dated Sep. 10, 2020.
International Search Report and Written Opinion dated Sep. 9, 2019 for International Application No. PCT/GB2019/050549.

* cited by examiner

FORMATION OF PIEZOELECTRIC DEVICES

FIELD

The present disclosure relates to the formation of piezoelectric devices such as ultrasonic transducers.

BACKGROUND

Ultrasound spans the range of sound frequencies that are higher than the range that can be heard by humans, and generally have frequencies of greater than 20 kHz. Typical ranges of operation extend from 100 kHz up to several Gigahertz. Due to the much higher frequencies involved, ultrasonic devices are typically very different from those generally used for audible applications.

Analysis using ultrasound waves shows great promise in a range of applications, particularly in imaging such as medical imaging but also in fields such as non-destructive testing (NDT), particularly in industrial NDT. Dental imaging using ultrasonic techniques is one example of a suitable application, wherein the ultrasound imaging can be used to determine properties of the layers of the tooth, e.g. of the enamel, dentine and pulp, and determine and characterise the thickness of the layers and any defect, disease or other issues therein. However, ultrasound has a wide range of uses and the applications of ultrasound are not limited to these examples.

The ultrasound transducer is operable to produce ultrasonic waves that are transmitted into the sample (e.g. a tooth or hard material) and detect reflections of the ultrasonic waves that are reflected from the interfaces between the layers of the sample (e.g. the interfaces between the enamel and dentine or between the dentine and pulp). By using techniques such as time of flight and other analyses, it is possible to image the layers of the sample (e.g. tooth) and thereby characterise the sample. Application of ultrasound in this application is particularly advantageous, as traditional techniques of imaging teeth involve the use of x-rays, which are potentially harmful to both the recipient and the medical practitioner administering the radiation and require secure, expensive and time-consuming control of radioactive substances.

Conventional ultrasonic transducers are generally formed from bulk ceramic materials, which can be high cost, bulky and difficult to manufacture, particularly with the shapes and properties desired for many applications. Traditional ceramic materials used in ultrasound are generally not suitable for very high temperature operation, making them unsuitable for some applications. In particular, the combination of being able to operate at high temperature and with sufficient resolution is problematic for many traditional ultrasound transducers. Furthermore, traditional ultrasound transducers are not easy to manufacture using automated techniques and often require a high degree of manual operation. Improved ultrasonic transducers and methods for manufacturing them are therefore desirable.

SUMMARY

Various aspects of the present invention are defined in the independent claims. Some preferred features are defined in the dependent claims.

According to a first aspect of the present disclosure is a method for producing a piezoelectric device, such as an ultrasound transducer or ultrasonic transducer array, the method comprising:

providing or depositing a layer of piezoelectric material on a substrate.

The deposition of the layer of piezoelectric material may be by sputter coating. The layer of piezoelectric material may be provided or deposited only on one surface, e.g. one planar surface, of the substrate. The layer of piezoelectric material may be provided or deposited on part or all of the surface, e.g. one planar surface, of the substrate.

The piezoelectric material may be or comprise a doped or alloyed piezoelectric material. The sputter coating may comprise using a sputtering target that is formed from, comprises, or has the same constituents as, the piezoelectric material that forms the layer of piezoelectric material in the final piezoelectric device.

The piezoelectric material and/or sputtering target may be or comprise a primary piezoelectric material such as a metal oxide or metal nitride, such as zinc oxide or aluminium nitride, or a doped or alloyed metal oxide or metal nitride. The piezoelectric material and/or sputtering target may comprise a dopant or further material (such as an alloying material or a co-deposited material), which may be or comprise a transition metal or compound thereof. The dopant or further material may be vanadium, for example. The dopant or further material may be present in the piezoelectric material and/or sputtering target at a level up to 10% with respect to weight, e.g. from 0.01 to 10% w/w. The primary piezoelectric material, e.g. the metal oxide or metal nitride, may be present in the layer of piezoelectric material in levels from 90% w/w up to 99.99% w/w. The dopant or other material may be integrated, co-deposited or reacted into the primary piezoelectric material, e.g. alloyed with or doped into the primary piezoelectric material, and may not be mixed with or coated onto or in discrete domains with the primary piezoelectric material.

The method may comprise depositing the piezoelectric coating using magnetron sputter deposition, e.g. direct current (DC), pulsed DC, radio-frequency, closed field magnetron (CFM) sputtering and/or high power impulse magnetron sputtering (HIPIMS). Further enhancement may be obtained using substrate biasing (e.g. DC and/or RF), which may optimise sputter plasma ion energy during film growth. These particular techniques may provide beneficial film growth morphology and/or enhanced piezoelectric properties of the piezoelectric layer.

The dopant or further material may be incorporated with the primary piezoelectric material such as the metal, metal oxide or metal nitride during deposition of the layer of piezoelectric material. The dopant or further material may be incorporated within the sputtering target, e.g. by doping or alloying with the primary piezoelectric material such as the metal oxide or metal nitride or through co-deposition, e.g. from multiple sputter magnetrons. The dopant or further material may not be coated, adhered or provided separately to the primary piezoelectric material in the sputtering target and/or in the layer of piezoelectric material.

The dopant or further material may be co-deposited with the primary piezoelectric material (e.g. the metal, metal oxide or metal nitride). For example, the dopant or further material may be provided by a target or sputtering arrangement and the primary piezoelectric material (e.g. the metal, metal oxide or metal nitride) may be provided by a different target or sputtering arrangement. Providing the layer of piezoelectric material by co-depositing the primary piezoelectric material and the dopant or other material may allow the stoichiometry to be more easily adjusted or otherwise varied, e.g. on the fly.

The method may comprise depositing the layer of piezoelectric material on the substrate using a rotating drum arrangement, e.g. the substrate may be provided on a rotating drum whilst the piezoelectric layer is deposited onto the substrate. The arrangement may facilitate a higher throughput.

In this way, a more uniform and/or consistent piezoelectric layer can be provided. Furthermore, the deposition process may be accelerated and/or thicker layers of piezoelectric material achieved in a given processing time. In addition, the amount of pinholes and other defects may be reduced.

The layer of piezoelectric material may be, comprise or be comprised in a film of piezoelectric material. The layer of piezoelectric material may be configured and/or operable to produce ultrasound, i.e. the layer of piezoelectric material may be or comprise an ultrasound production layer. The piezoelectric material may be or comprise an inorganic material. The piezoelectric material may be a crystalline, e.g. polycrystalline or columnar piezoelectric material. The layer of piezoelectric material may be a layer of non-polymeric piezoelectric material. The piezoelectric material may be or comprise a continuous layer of material having piezoelectric properties, e.g. the piezoelectric material may not comprise discrete domains of piezoelectric material having piezoelectric properties within a matrix of non-piezoelectric material. The layer of piezoelectric material may have a thickness in the range of 2 to 20 µm. The layer of piezoelectric material may be thinner than the substrate.

The method may comprise providing at least one electrode on the layer of piezoelectric material. The method may comprise providing a plurality of the electrodes in an electrode array on the layer of piezoelectric material. The method may comprise providing at least one electrical conduction track and/or at least one electrical connector, e.g. on the surface of the piezoelectric material or on an electrically resistive layer disposed thereon. Respective electrical conduction tracks may electrically connect a respective electrode to a respective electrical connector. However, other arrangements for providing electrodes and/or electrically connecting the electrodes and/or electrically coupling the layer of piezoelectric material may be used.

The ultrasonic device may be an ultrasonic device for imaging, measurement or testing, e.g. non-destructive testing.

The method may comprise providing a secondary layer. The secondary layer may comprise an encapsulating material. The secondary layer may be or comprise a dielectric material. The secondary layer may be or comprise a polymeric material, such as a dielectric polymer. The secondary layer may be thinner than the substrate. The secondary layer may be less than 50 µm thick, e.g. between 1 and 50 µm thick. The secondary layer may comprise or be formed from an epoxy, a polyimide, a poly para-xylene, or the like.

The secondary layer may be provided directly on, over or overlying at least part of a surface of the layer of piezoelectric material. The secondary layer may be provided directly on, over or overlying an opposite side of the layer of piezoelectric material to the substrate. The secondary layer may be provided directly on, around and/or between at least part or all of the electrical conduction tracks and/or the at least one electrode (e.g. the electrodes of the array of electrodes). The secondary layer may be electrically insulating. The secondary layer may leave at least part or all of the connectors exposed. The secondary layer may be provided only on the piezoelectric material and/or the electrically conducting material that forms the electrical conduction tracks and/or the at least one electrode. The secondary layer may not be directly provided on the substrate or at least not directly on the side of the substrate that is opposite the side of the substrate upon which the piezoelectric material is provided.

The method may comprise applying the secondary layer by spin coating, vapour deposition and/or the like.

By providing the secondary layer, the frequency of vibrations may be controlled, e.g. depending on the thickness of the secondary layer. For example, the secondary layer may lower the frequency of operation of the piezoelectric device and/or damp higher frequency vibrations (such as those above 20 MHz), e.g. to tailor the piezoelectric device for lower frequency operations (such as those from 1 to 20 MHz). The provision of the secondary layer may reduce pinholes or other defects. The provision of the secondary layer may result in a higher yield of the piezoelectric devices and/or permit larger electrode sizes. The provision of the secondary layer may permit high voltage operations and may improve electrical durability. The provision of the secondary layer may result in a lower failure rate, e.g. due to curving and flexing, which may improve mechanical durability.

The substrate may be electrically conductive, i.e. it may be an electrical conductor. The substrate may be planar. The substrate may be a film or sheet. The substrate may be metallic, e.g. a metal film. The substrate may be or comprise a metal or metallic foil such as aluminium foil.

The substrate may be, comprise, or be comprised in an electrical ground electrode. The substrate may be, comprise, or be comprised in a counter electrode to the working electrode(s). The counter or ground electrode may form an electrode pair with the at least one working electrode (e.g. the working electrodes of the electrode array), which may be provided on an opposing side of the piezoelectric material to the counter or ground electrode. A surface of the substrate that is opposite to a surface of the substrate upon which the layer of piezoelectric material is disposed may be a radiating surface from which ultrasonic waves are radiated in use.

The substrate may be or comprise a thin foil. The substrate may have a thickness in the range of 20 to 200 µm. The substrate may be thicker than the layer of piezoelectric material, e.g. by at least a factor of 6 or by a factor of 10 or more.

The method may comprise removing selected portions of the layer of piezoelectric material, e.g. so as to expose a corresponding area of a surface of the substrate upon which the rest of the layer of piezoelectric material is disposed. The method may comprise removing or etching selected portions of the layer of piezoelectric material using acid, such as hydrochloric acid, or other suitable chemical agent.

The method may comprise making an electrical connection directly to the surface of the substrate upon which the rest of the layer of piezoelectric material is disposed, e.g. to the area of the substrate from which the piezoelectric material was removed. The electrical connection may be to ground such that the substrate is connected to ground via the connection, e.g. so that the substrate functions as a ground electrode. No direct electrical connections may be made to the substrate other than to the surface of the substrate upon which the piezoelectric material is disposed.

In this way, all of the electrical connections to the piezoelectric device may be on the same side of the substrate and the resulting device, e.g. a side of the device opposite to a radiating surface of the substrate. Furthermore, no folding of the substrate may be required to form the ground connection. This may eliminate a point of potential failure.

There may also be no damage or components located on the emission surface, e.g. there may be no electrodes or electrical connections on the emission surface, which may ensure that the radiating surface (equivalent to an active surface of the piezoelectric device) is not compromised. This may also increase durability.

The piezoelectric device may be flexible. The substrate, the layer of piezoelectric material and the at least one electrode, at least one electrical conduction track and/or at least one electrical connector may be flexible.

Advantageously, the ultrasonic transducer produced by the above method may provide a continuous efficiency of acoustic output at high temperature operation. This may be particularly beneficial in non-destructive testing applications. The flexibility in the resulting transducer may allow the transducer to be more easily conformed to a desired shape, which may be particularly beneficial in certain applications, such as non-destructive testing. In addition, the resulting ultrasonic transducer may be capable of high resolution, which may be particularly beneficial in certain applications such as medical and dental applications. Of general benefit, the above method may be used to achieve scaleable mass manufacturing at low cost.

According to an aspect of the present disclosure is a piezoelectric device, such as an ultrasound transducer or ultrasonic transducer array, the piezoelectric device comprising:

a layer of piezoelectric material on a substrate.

The piezoelectric material may be sputter coated. The piezoelectric device may be formed using the method of the first aspect.

The piezoelectric material may be or comprise a doped or alloyed piezoelectric material. The piezoelectric material may be or comprise a metal oxide or metal nitride, such as zinc oxide or aluminium nitride, or a doped or alloyed metal oxide or metal nitride. The piezoelectric material and/or sputtering target may comprise a dopant or further (e.g. alloying or co-deposited) material, which may be or comprise a transition metal or a compound thereof. The dopant or further material may be or comprise vanadium, for example. The dopant or further material may be present in the piezoelectric material at a level up to 10% w/w, e.g. from 0.01 to 10% w/w. The metal oxide or metal nitride may be present in the layer of piezoelectric material in levels from 90% up to 99.99% w/w. The dopant or other material may be integrated or reacted into the piezoelectric material, e.g. alloyed with, co-deposited with or doped into the piezoelectric material, and may not be mixed with or coated onto or in discrete domains within the piezoelectric material. The ultrasonic device may be an ultrasonic device for imaging, measurement or testing, e.g. non-destructive testing.

The layer of piezoelectric material may be, comprise or be comprised in a film of piezoelectric material. The layer of piezoelectric material may be configured and/or operable to produce ultrasound, i.e. the layer of piezoelectric material may be or comprise an ultrasound production layer. The layer of piezoelectric material may be or comprise a layer of inorganic material. The layer of piezoelectric material may be or comprise a layer of crystalline, e.g. polycrystalline and/or columnar, piezoelectric material. The layer of piezoelectric material may be or comprise a layer of non-polymeric piezoelectric material. The piezoelectric material may be or comprise a continuous layer of material having piezoelectric properties, e.g. the piezoelectric material may not comprise discrete domains of piezoelectric material having piezoelectric properties within a matrix of non-piezoelectric material. The layer of piezoelectric material may have a thickness in the range of 2 to 20 μm. The layer of piezoelectric material may be thinner than the substrate.

The piezoelectric device, e.g. the ultrasonic transducer or transducer array, may comprise at least one electrode on the layer of piezoelectric material. The piezoelectric device, e.g. the ultrasonic transducer or transducer array, may comprise a plurality of the electrodes in an electrode array on the layer of piezoelectric material. The piezoelectric device, e.g. the ultrasonic transducer or transducer array, may comprise at least one electrical conduction track and/or at least one electrical connector, e.g. on the surface of the piezoelectric material or on an electrically resistive layer disposed thereon. Respective electrical conduction tracks may electrically connect a respective electrode to a respective electrical connector. However, other electrode and/or electrical connector arrangements and/or other methods for electrically coupling the layer of piezoelectric material to external systems may be used.

The piezoelectric device may comprise a secondary layer. The secondary layer may comprise an encapsulating material. The secondary layer may be or comprise a dielectric material. The secondary layer may be or comprise a polymeric material, such as a dielectric polymer. The secondary layer may be thinner than the substrate. The secondary layer may be less than 50 μm thick, e.g. between 1 and 50 μm thick. The secondary layer may comprise or be formed from an epoxy, a polyimide, a poly para-xylene, or the like.

The secondary layer may be provided directly on, over or overlying at least part of a surface of the layer of piezoelectric material. The secondary layer may be provided directly on, over or overlying an opposite side of the layer of piezoelectric material to the substrate. The secondary layer may be provided directly on, around and/or between at least part or all of the electrical conduction tracks and/or the at least one electrode (e.g. the electrodes of the array of electrodes). The secondary layer may be electrically insulating. The secondary layer may leave at least part or all of the connectors exposed. The secondary layer may be provided only on the piezoelectric material and/or the electrically conducting material that forms the electrical conduction tracks and/or the at least one electrode, i.e. not on the substrate or at least not on the side of the substrate that is opposite the side of the substrate upon which the piezoelectric material is provided.

The substrate may be electrically conductive, i.e. it may be an electrical conductor. The substrate may be planar. The substrate may be a film or sheet. The substrate may be metallic, e.g. a metal film. The substrate may be or comprise a metal or metallic foil such as aluminium foil.

The substrate may be, comprise, or be comprised in an electrical ground electrode. The substrate may be, comprise, or be comprised in a counter electrode to the working electrode(s). The counter or ground electrode may form an electrode pair with the at least one working electrode (e.g. the working electrodes of the electrode array), which may be provided on an opposing side of the piezoelectric material to the counter or ground electrode. A surface of the substrate that is opposite to a surface of the substrate upon which the layer of piezoelectric material is disposed may be a radiating surface from which ultrasonic waves are radiated in use.

The substrate may be or comprise a thin foil. The substrate may have a thickness in the range of 20 to 200 μm. The substrate may be thicker than the layer of piezoelectric material, e.g. by at least a factor of 6 or by a factor of 10 or more.

Selected portions of the layer of piezoelectric material may be exposed, e.g. an area of a surface of the substrate upon which the rest of the layer of piezoelectric material is disposed may be exposed. The piezoelectric device may comprise an electrical connection directly to the surface of the substrate upon which the rest of the layer of piezoelectric material is disposed, e.g. to the exposed area of the substrate. The electrical connection may be to ground such that the substrate is connected to ground via the connection, e.g. so that the substrate functions as a ground electrode. No direct electrical connections may be made to the substrate other than the surface of the substrate upon which the piezoelectric material is disposed.

The piezoelectric device may be flexible. The substrate, the layer of piezoelectric material and the at least one electrode, at least one electrical conduction track and/or at least one electrical connector may be flexible.

According to a third aspect of the present disclosure is a set of computer readable instructions or computer code configured such that, when processed by manufacturing equipment, permit, control or cause the manufacturing equipment, or provide instructions or data for the manufacturing equipment, to produce at least part of the piezoelectric device, e.g. the ultrasonic transducer or ultrasonic transducer array, of the second aspect or to perform at least some of the steps of the method of the first aspect.

The manufacturing equipment may be, comprise or be comprised in a sputtering system.

The manufacturing equipment may be computer controlled or controllable.

The set of computer readable instructions or computer code may be configured such that, when processed by the manufacturing equipment, permit, control, cause or provide instructions or data for the additive manufacturing equipment to deposit the piezoelectric layer onto the substrate to at least partly form the device of the second aspect or that are part of the method of the first aspect.

According to a fourth aspect of the present disclosure is an ultrasonic device configured to produce and emit ultrasonic waves, the ultrasonic device comprising the piezoelectric device of the second aspect.

The ultrasonic device may be configured to receive reflections of the emitted ultrasonic waves. The ultrasonic device may be an ultrasonic device for imaging, measurement or testing, e.g. non-destructive testing.

The ultrasonic device may be a medical ultrasound imager. The ultrasonic device may be a non-destructive testing device. The ultrasonic device may be a dental ultrasound imager for imaging the structure or teeth.

According to a fifth aspect of the present disclosure is a method for producing an ultrasonic transducer or ultrasonic transducer array, the method comprising:
  depositing a layer of piezoelectric material on a substrate by sputter coating, wherein the piezoelectric material is or comprises a doped, co-deposited or alloyed piezoelectric material.

The sputter coating of the substrate may be carried out using a sputter coating system having a sputter target that is formed from or comprises the doped or alloyed piezoelectric material.

The method may comprise depositing the piezoelectric coating using magnetron sputter deposition, e.g. direct current (DC), pulsed DC, radio-frequency, closed field magnetron (CFM) sputtering and/or high power impulse magnetron sputtering (HIPIMS). Further enhancement may be obtained using substrate biasing (e.g. DC and/or RF), which may optimise sputter plasma ion energy during film growth. These particular techniques may provide beneficial film growth morphology and/or enhanced piezoelectric properties of the piezoelectric layer.

The dopant or further material may be incorporated with the primary piezoelectric material such as the metal, metal oxide or metal nitride during deposition of the layer of piezoelectric material. The dopant or further material may be incorporated within the sputtering target, e.g. by doping or alloying with the primary piezoelectric material such as the metal oxide or metal nitride or through co-deposition, e.g. from multiple sputter magnetrons. The dopant or further material may be co-deposited with the primary piezoelectric material (e.g. the metal, metal oxide or metal nitride). For example, the dopant or further material may be provided by a target or sputtering arrangement and the primary piezoelectric material (e.g. the metal, metal oxide or metal nitride) may be provided by a different target or sputtering arrangement.

The method of the fifth aspect may further comprise any of the features or steps described above in relation to the first aspect.

According to a sixth aspect of the present disclosure is an ultrasonic transducer or ultrasonic transducer array comprising a layer of piezoelectric material on a substrate, wherein the piezoelectric material is or comprises a doped, co-deposited or alloyed piezoelectric material.

The ultrasonic transducer or transducer array may further comprise any of the features described above in relation to the second aspect. The ultrasonic transducer or transducer array may be produced using the method of the fifth aspect.

According to a seventh aspect of the present invention is a method for producing an ultrasound transducer or ultrasonic transducer array, the method comprising:
  providing a layer of piezoelectric material on a substrate; and
  providing a secondary layer directly on, over or overlying at least part of a surface of the layer of piezoelectric material and/or at least one electrical conduction track and/or at least one electrode provided on the layer of piezoelectric material; wherein
  the secondary layer is or comprises a layer of dielectric material, such as a dielectric polymer.

The method may further comprise any of the features or steps described above in relation to the first aspect.

According to an eighth aspect of the present disclosure is an ultrasonic transducer or ultrasonic transducer array comprising:
  a layer of piezoelectric material on a substrate; and
  a secondary layer directly on, over or overlying at least part of a surface of the layer of piezoelectric material and/or at least one electrical conduction track and/or at least one electrode provided on the layer of piezoelectric material; wherein
  the secondary layer is or comprises a layer of dielectric material, such as a dielectric polymer.

The ultrasonic transducer or transducer array may further comprise any of the features described above in relation to the second aspect.

According to a ninth aspect of the present invention is a method for producing an ultrasonic transducer or ultrasonic transducer array, the method comprising:
  providing a layer of piezoelectric material on a substrate; and
  making an electrical connection directly to the surface of the substrate upon which the rest of the layer of piezoelectric material is disposed.

The method may comprise removing selected portions of the layer of piezoelectric material, e.g. so as to expose a corresponding area of a surface of the substrate upon which the rest of the layer of piezoelectric material is disposed. The method may comprise removing or etching selected portions of the layer of piezoelectric material using acid, such as hydrochloric acid, or other suitable chemical agent. The method may comprise making the electrical connection directly to the exposed area of the substrate from which the piezoelectric material was removed.

The layer of piezoelectric material may be provided on only part of a surface of the substrate, e.g. leaving exposed part of the surface of the substrate upon which the layer of piezoelectric material is disposed. The method may comprise making the electrical connection directly to the exposed part of the surface of the substrate upon which the layer of piezoelectric material is disposed.

The electrical connection may be a ground connection such that the substrate is operable as a ground electrode.

The method may further comprise any of the features or steps described above in relation to the first aspect.

According to an tenth aspect of the present disclosure is an ultrasound transducer or ultrasonic transducer array comprising:
 a layer of piezoelectric material provided on part of a surface of a substrate; and
 an electric connection directly connected to another part of the surface of the substrate that is not covered by the layer of piezoelectric material.

The electrical connection may be a ground connection such that the substrate is operable as a ground electrode.

The ultrasonic transducer or transducer array may further comprise any of the features described above in relation to the second aspect.

According to a tenth aspect of the present disclosure is a material, such as a piezoelectric material, comprising a doped, co-deposited, fused or alloyed metal compound, such as a metal oxide or metal nitride, the metal compound (e.g. the metal oxide or metal nitride) being doped, co-deposited, fused or alloyed with a transition metal or a compound thereof. The metal oxide may be a zinc oxide, e.g. ZnO. The metal nitride may be an aluminium nitride, e.g. AlN. The transition metal or compound thereof may be or comprise vanadium or a compound thereof. For example, the material may comprise a doped, co-deposited, fused or alloyed metal oxide or metal nitride, and the metal oxide or metal nitride may be doped, co-deposited, fused or alloyed with vanadium or a compound thereof. The material may be or comprise a zinc oxide doped, co-deposited, fused or alloyed with a transition metal or a compound thereof. The material may be used or formed as the piezoelectric material in the method or device of any of the previous aspects.

The individual features and/or combinations of features defined above in accordance with any aspect of the present invention or below in relation to any specific embodiment of the invention may be utilised, either separately and individually, alone or in combination with any other defined feature, in any other aspect or embodiment of the invention.

Furthermore, the present invention is intended to cover apparatus configured to perform any feature described herein in relation to a method and/or a method of using, producing or manufacturing any apparatus feature described herein. For any of the apparatus features described above as performing a function, the present invention also covers a method comprising performing that function.

BRIEF DESCRIPTION OF THE DRAWINGS

These and other aspects of the present disclosure will now be described, by way of example only, with reference to the accompanying Figures, in which:

FIGS. 2 to 6 are schematic illustrations of examples of the steps of the method of FIG. 1, wherein:

FIG. 2 is a schematic of a step of depositing a piezoelectric layer onto a conducting planar substrate;

FIG. 3 is a schematic of a step of adding electrodes, conductive tracks and connectors;

FIG. 4 is a schematic of a step of etching away a portion of the layer of piezoelectric material from the substrate;

FIG. 5 is a schematic showing the fixing of a ground connection;

FIG. 6 is a schematic showing the provision of a dielectric layer;

DETAILED DESCRIPTION OF THE DRAWINGS

Figure 1:
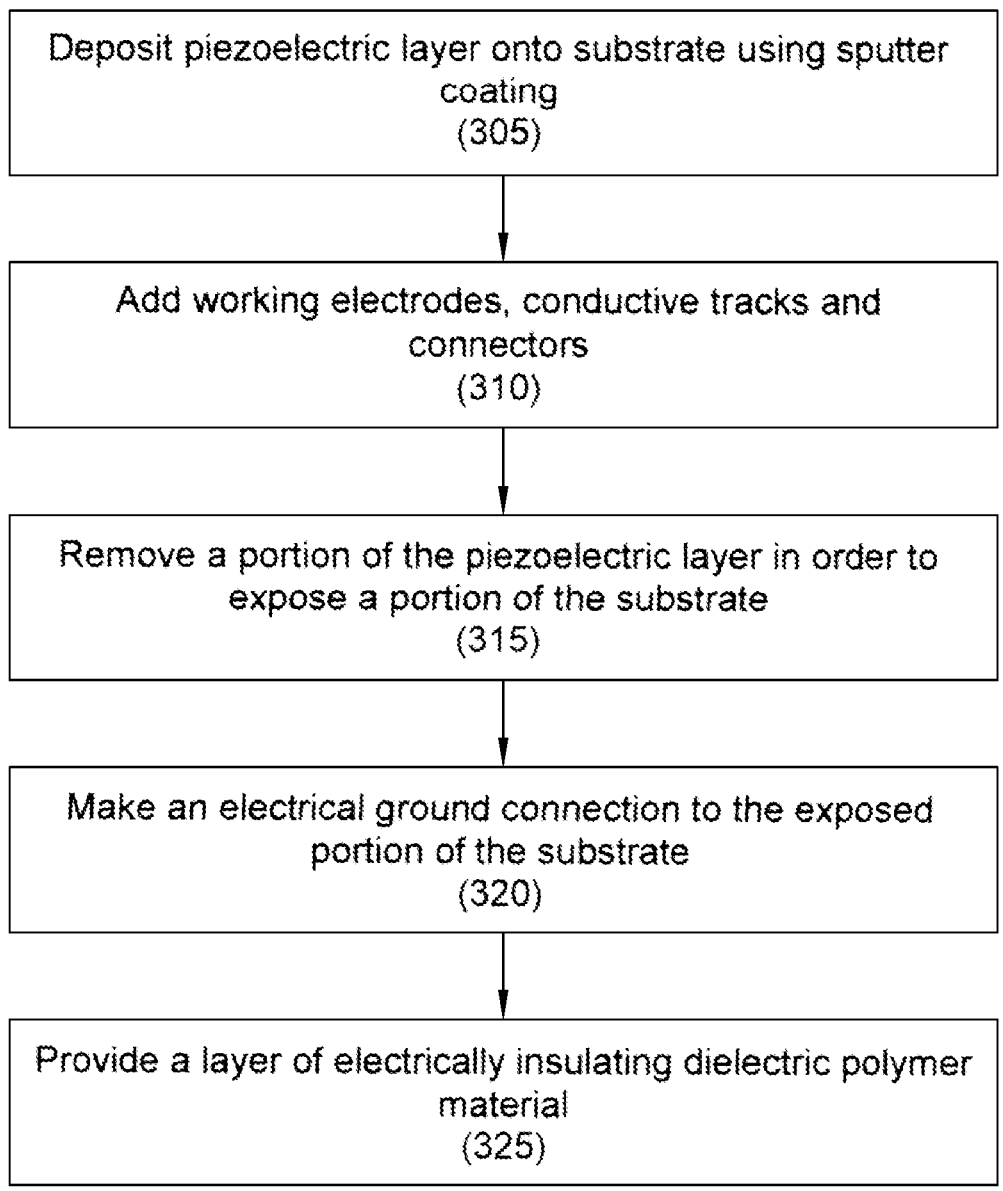
FIG. 1 is a flowchart showing a method of producing an ultrasonic transducer.

A process for producing an ultrasonic transducer 5 (see FIGS. 7 and 8) is shown in FIGS. 1 to 6. FIG. 1 shows a flowchart of the manufacturing process. FIGS. 2 to 6 illustrate the steps in the manufacturing process. FIGS. 3A, 4A, 5A and 6A show a side cross sectional view of the part that will become the ultrasonic transducer 5 and FIGS. 3B, 4B, 5B and 6B show a planar view.

Figure 2:
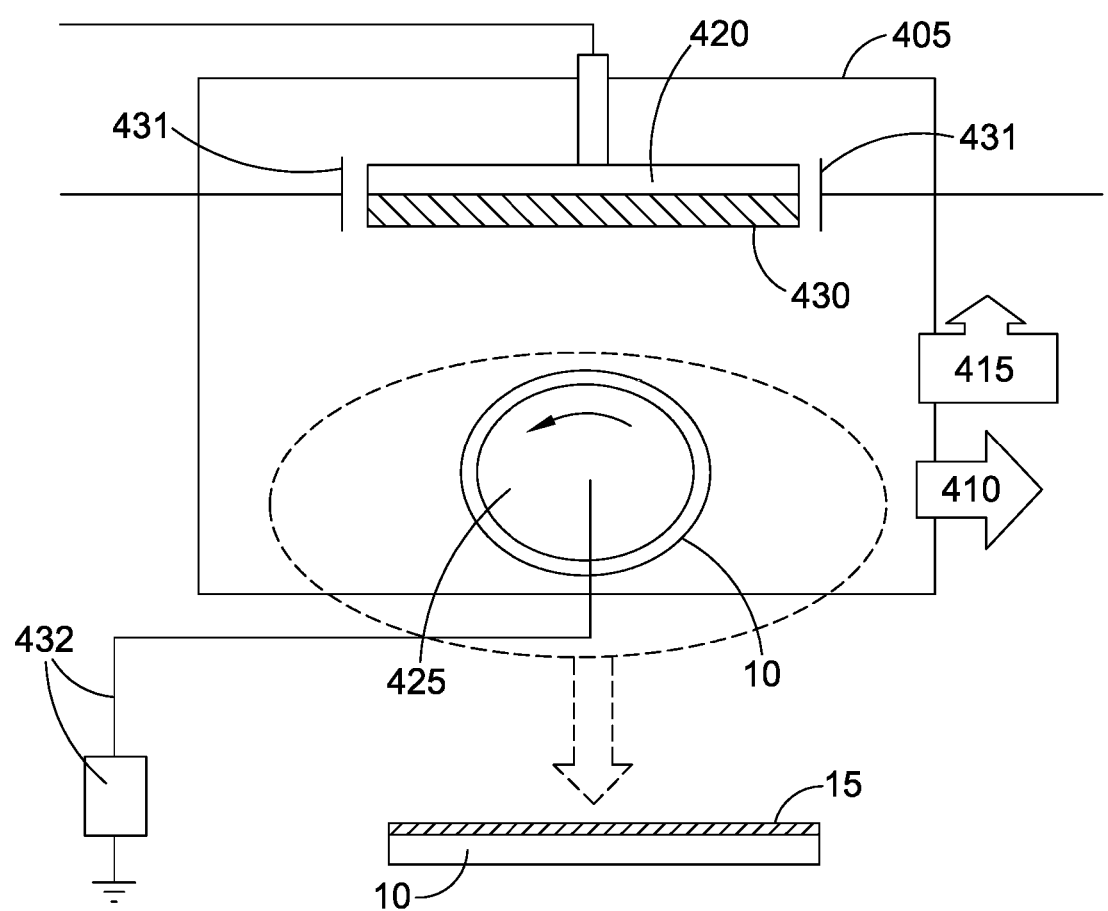

As indicated in step 305 of FIG. 1 and as shown in FIG. 2, a substrate 10 in the form of a metal foil, such as aluminium foil is sputter coated on one side with a thin layer of polycrystalline piezoelectric material 15, such as transition metal doped metal oxide. In this example, the piezoelectric material is a vanadium doped zinc oxide (ZnO) or aluminium nitride (AlN), but other transition metal dopants or other metal salts exhibiting piezoelectric properties could be used. The substrate can be from 20 to 200 µm thick. The layer of piezoelectric material 15 is of the order of a $10^{th}$ of the thickness of the substrate 10, e.g. from 2 to 20 µm thick.

Beneficially, the layer of piezoelectric material 15 is deposited onto the substrate 10 by sputter coating. For example, the piezoelectric material 15 could be deposited using a magnetron based sputtering, such as closed field magnetron sputtering or high power impulse magnetron sputtering, which may optimize the piezoelectric properties of the film and/or the growth morphology.

In an example shown in FIG. 2, the coating of the piezoelectric material 15 onto the substrate 10 is performed using high power impulse magnetron sputtering (HI PIMS), but the invention is not limited to this. As shown in FIG. 2, sputter coating is generally performed in a low pressure chamber 405 having an outlet 410 to a vacuum pump, an inlet 415 for allowing inert gasses to be admitted, an electrode 420, a counter electrode 425 in the form of a rotating drum, a target 430 electrically connected to the electrode 420, and the substrate 10 being provided on a surface of the rotating drum counter electrode 425. A grounded magnetron anode 431 is provided proximate the target 430. A pulsed high voltage power supply (not shown) is connected to the electrode 420 that is coupled to the target 430.

A separate substrate bias voltage power supply 432 is electrically connected to the rotating drum electrode 425 and operable to provide DC or RF biasing to the substrate 10. An electric field is generated to guide ionized sputtered material from the target 430 onto the substrate 10. The substrate bias voltage can be varied or selected in order to attract ionized sputtered material from the target 430 to the substrate 10 to control the energy of the arriving ions. This may optimise sputter plasma ion energy during film growth. The drum 425 would normally float electrically and the substrate bias voltage from the substrate bias voltage power supply 432 is applied through a rotational feedthrough/shaft of the rotating drum 425, thereby applying a voltage (bias) direct to the drum 425.

The target 430 is formed from the transition metal doped piezoelectric material, e.g. from vanadium doped zinc oxide. Importantly, the elements that will form the layer of piezoelectric material are combined within the target, e.g. by being alloyed or doped, rather than being provided separately or discretely, e.g. as mixtures or by the doping transition metals being adhered or otherwise provided on the surface of the metal oxide. In this way, the resultant layer of piezoelectric material 15 may have improved piezoelectric properties.

Furthermore, the rate of deposition may be increased, allowing shorter deposition times and/or thicker growth of the layer of piezoelectric material in a given time. In addition, fewer pinholes and other defects may occur.

The target 430 and the layer of piezoelectric material 15 have levels of the active piezoelectric material, e.g. the metal oxide or nitride such as the ZnO or AlN, of 90% w/w and above, e.g. from 90% to 99.99% w/w. The dopant/alloying material, e.g. the transition metal, is present in the target 420 and the layer of piezoelectric material 15 in levels of 10% w/w and less, e.g. from 0.01% to 10% w/w.

A high voltage is provided between the electrode 420 and the counter electrode 425 that acts to form a plasma in the chamber. Ions from the plasma are accelerated into the target 430, sputtering the doped piezoelectric material from the target 430, which is then deposited on the surface of the substrate 10 by a process of adsorption. The result of this is the substrate 10 being coated on one side with the layer of transition metal doped piezoelectric material 15.

Figure 3A:
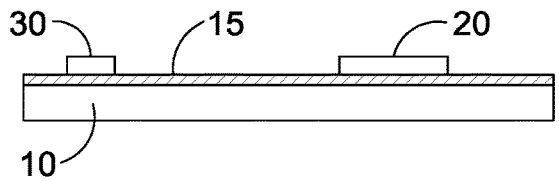
Figure 3B:
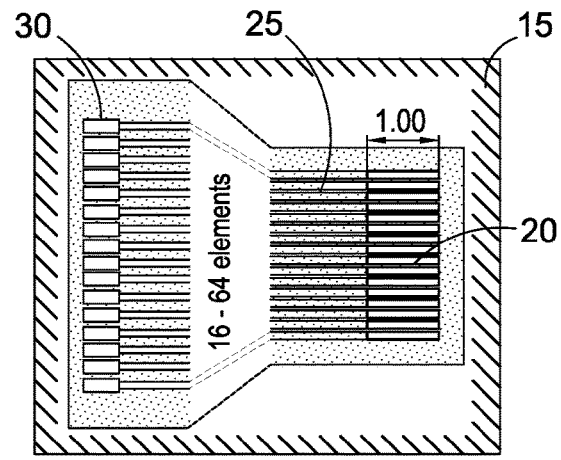

In step 310 and as shown in FIGS. 3A and 3B, the plurality of working electrodes 20 respectively connected by corresponding conductive tracks 25 to corresponding electrical connectors 30 are provided on a surface of the layer of piezoelectric material 15 that is opposite to the substrate 10. These may be provided by techniques such as photo-masking and deposition, printing, selective patterning, and/or the like.

Figure 4A:
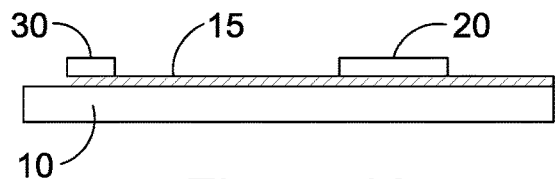
Figure 4B:
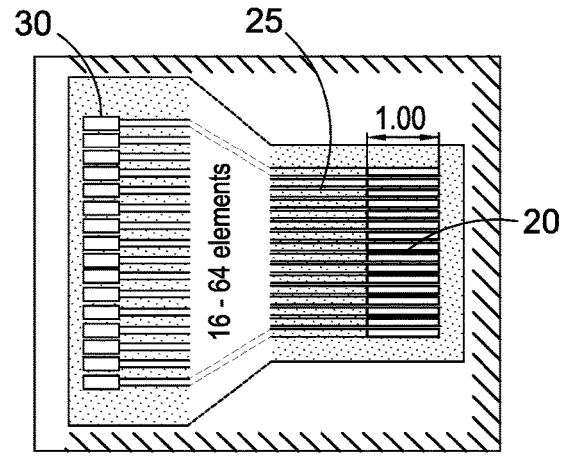

In step 315 and as shown in FIGS. 4A and 4B, a portion of the layer of piezoelectric material 15 is removed to expose a corresponding portion of a surface of the substrate 10 upon which the layer of piezoelectric material 15 is disposed. The portion of piezoelectric material 15 may be removed by selective etching, e.g. using an acid such as hydrochloric acid.

Figure 5A:
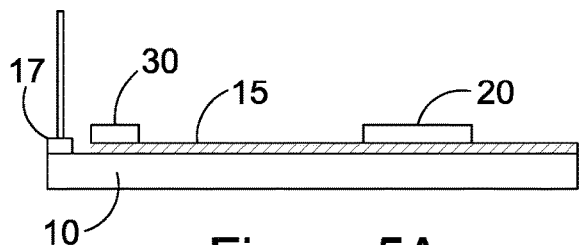
Figure 5B:
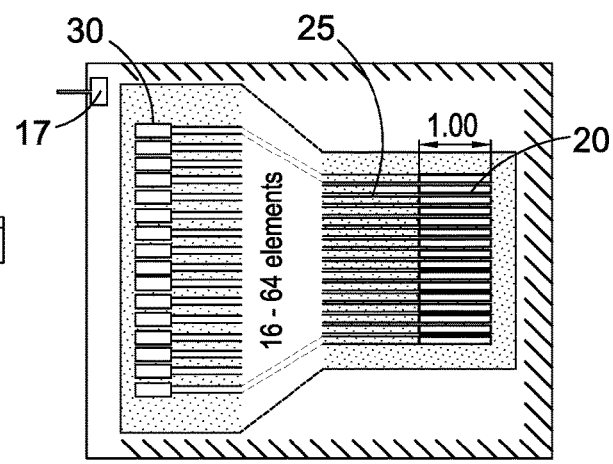

As indicated in step 320 and as shown in FIGS. 5A and 5B the electrical ground connection 17 is directly attached to this exposed portion of the surface of the substrate 10 upon which the layer of piezoelectric material 15 is disposed. In this way, all of the electrical connections of the substrate 10 (i.e. the ground connection 17 and the connection to the layer of piezoelectric material 15 and thereby to the working electrodes 20) are to the same surface of the substrate 10 and no connections are directly made to the opposite surface of the substrate (i.e. the radiating surface from which the ultrasonic waves are radiated in use). With this construction, no folding of the material is required, which may otherwise provide a point of potential failure. Furthermore, there is no damage or unwanted modification of the radiating surface of the substrate 10, such that the radiating surface is not compromised.

Figure 6A:
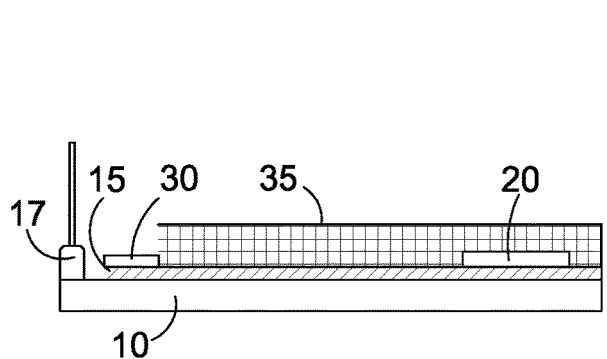
Figure 6B:
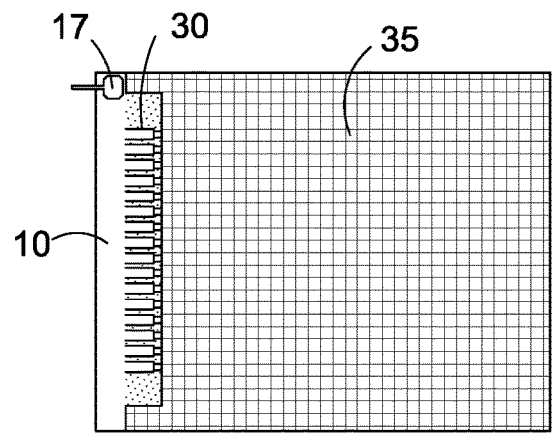

In step 325 of FIG. 1 and as shown in FIGS. 6A and 6B, the electrically insulating dielectric material 35 is provided over and around the outer surface of the layer of piezoelectric material 15 (i.e. the surface that is opposite to the surface that abuts the substrate 10), the electrodes 20 and the conductive tracks 25 in order to protect and insulate them. The dielectric material 35 is also disposed between the electrodes 20 and between the conductive tracks 25. The dielectric material 35 can be any suitable dielectric polymer material, such as an epoxy, a polyimide, a poly para-xylene, or the like. However, the contacts 30 and the ground connection 17 are left exposed so that they can form the required electrical connections.

The dielectric material 35 is generally thinner than the substrate, e.g. being 50 microns or less in thickness. The dielectric material 35 can be applied by suitable techniques known in the art such as by spin coating or by vapour deposition.

The above provision of the dielectric material 35 may confer advantages in the ultrasonic transducer array 5. For example, the operational frequency may be lowered or high frequency vibrations (e.g. those greater than 20 MHz) may be damped, which is particularly beneficial in low frequency applications (e.g. in the range from 1 to 20 MHz). Furthermore, the electrical insulation it provides may reduce pinhole and other defect failures. It may also help the transducer array 5 withstand higher voltage pulsing and improve electrical durability. It may also improve mechanical durability and rescue failure due to curving and flexing.

Figure 7:
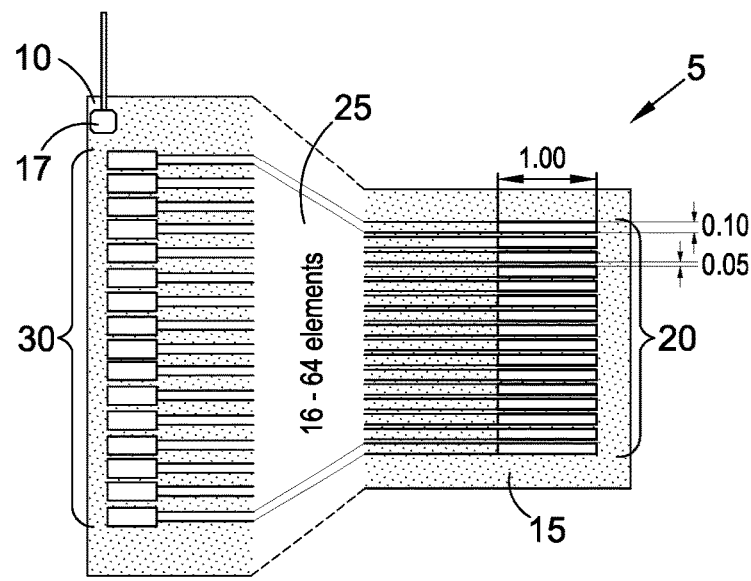
FIG. 7 is a schematic planar view of an example of a ultrasonic transducer array that could be produced using the method of FIGS. 1 to 6.
Figure 8:
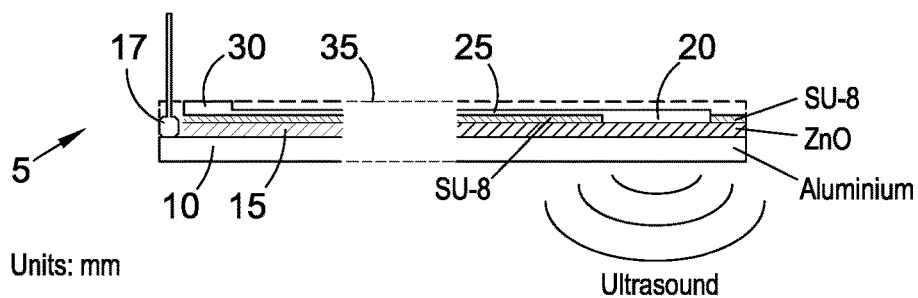
FIG. 8 is schematic side view of the transducer array of FIG. 7.

FIG. 7 shows a schematic planar view of an exemplary ultrasonic transducer array 5 that could be produced using the method of claims 1 to 6 and FIG. 8 shows a schematic side view of the ultrasonic transducer array 5. The ultrasonic transducer 5 shown in FIGS. 7 and 8 is provided only as an example of an ultrasonic transducer that can be produced using the method of FIGS. 1 to 6 and the method could also be applied to produce other ultrasonic transducers and transducer arrays.

The exemplary ultrasonic transducer array 5 comprises the electrically conductive substrate 10 in the form of a metal foil, in this case an aluminium foil, and the layer of crystalline piezoelectric material 15 disposed on one planar surface of the substrate 10. The substrate 10 acts to support the layer of piezoelectric material 15 and also functions as a ground electrode. A surface of the substrate 10 that is opposite to a surface upon which the layer of piezoelectric material is provided acts as an ultrasonic wave radiation surface from which ultrasonic waves are emitted from the transducer array in use. A portion of the surface of the substrate 10 that contacts the layer of piezoelectric material 15 is free of piezoelectric material and instead provided with an electrical ground connection 17.

The substrate 10 is much thicker (i.e. in the order of magnitude of 10 times thicker) than the layer of piezoelectric material 15 and in this example, the substrate 10 is between 20 and 200 µm thick and the layer of piezoelectric material 15 is between 2 and 20 µm thick. In this example, the piezoelectric material is vanadium doped ZnO but it will be appreciated that other suitable piezoelectric materials such as AlN and/or other dopants, particularly other transition metal dopants, could be used.

One or more working electrodes 20 are provided on a surface of the layer of piezoelectric material 15 that is on an opposite side of the layer of piezoelectric material 15 to the substrate 10. Each of the working electrodes 20 is connected to a corresponding electrically conductive track 25 that is in turn electrically connected to an associated electrical connector 30.

A layer of electrically insulating dielectric polymer material 35 is provided on the layer piezoelectric material and over and in between the electrodes 20 and the conductive tracks 25. Examples of suitable electrically insulating dielectric polymer material 35 include epoxy, polyimide, poly para-xylene, or the like. However, the connectors 30 and the connection of the substrate 10 to electrical ground are left exposed to allow electrical connections to a controller or processing device to be made. The radiating surface of the substrate 10 (i.e. the surface of the substrate opposite to the piezoelectric material 15) is also left exposed and clear of encapsulation material. The thickness of the layer of dielectric material 35 is in the range from 1 to 50 microns thick.

In order to generate the ultrasound, an alternating electrical driving current is applied to the appropriate connector 30 or connectors 30 and thereby via the conductive tracks 25 to the corresponding working electrode 20 or electrodes 20. The working electrodes 20 form a couple with the conductive substrate 10 that acts as a ground electrode (by virtue of the ground connection 17) in order to apply an alternating electrical current across the corresponding sections of the piezoelectric material 15. This in turn causes the corresponding sections of layer of piezoelectric material 15 to vibrate at high frequency along with the corresponding portion of the substrate 10 to thereby generate ultrasonic waves, which are emitted from portions of the outer surface of the substrate 10 that correspond to the driven working electrode(s) 20.

Although specific examples are described above in relation to the Figures, it will be appreciated that variations on the above examples are possible. As such, the scope of protection is defined by the claims and not by the above specific examples.

For example, although examples of piezoelectric materials being ZnO or AlN are given above, it will be appreciated that other piezoelectric materials could be used instead. Furthermore, although transition metal doped piezoelectric materials are described, it will be appreciated that non-doped piezoelectric materials could be used. In addition, although various thicknesses, dimensions, numbers and geometric arrangements of electrodes, conductive tracks and contacts are given above, it will be appreciated that other thicknesses, dimensions, numbers and geometric arrangements of electrodes, conductive tracks and contacts could be used. Indeed, although the electrodes are all shown as the same size and shape, it will be appreciated that at least some or all of the electrodes may be of different sizes and/or shapes. Although various specific examples of dielectric materials are given, other suitable dielectrics could be used. Although specific examples of etching agents are used, other suitable etching agents could alternatively be used.

Furthermore, although the example given above beneficially uses sputter coating of a transition metal doped metal oxide or metal nitride using a doped, alloyed or amalgam target, it will be appreciated that other methods of producing a suitably integral transition metal/metal oxide or metal nitride piezoelectric could be used. For example, the transition metal and the metal oxide or metal nitride could be co-deposited from a dual source system.

In addition, although the substrate 10 is shown in FIG. 2 on a rotating drum whilst the piezoelectric layer 15 is deposited onto the substrate 10, it will be appreciated that the substrate 10 may be provided on a flat, stationary surface.

The invention claimed is:

1. An ultrasound transducer for imaging, measurement or non-destructive testing, the transducer comprising:
   a flexible layer of piezoelectric material on a flexible substrate comprising a metallic foil, wherein the layer of the piezoelectric material has a thickness in a range of 2 µm to 20 µm, and the substrate has a thickness in a range of 20 µm to 200 µm, the piezoelectric material is a doped, co-deposited or alloyed piezoelectric material; and the piezoelectric material comprises:
   a doped, co-deposited or alloyed metal oxide or metal nitride, the metal oxide or metal nitride being doped, co-deposited or alloyed with vanadium or a compound thereof; or zinc oxide doped, co-deposited or alloyed with a transition metal or a compound thereof.

2. A set of computer readable instructions or process protocols or computer code configured such that, when processed by manufacturing equipment, permit, control or cause the manufacturing equipment, or provide instructions or data for the manufacturing equipment, to produce a flexible ultrasound transducer or ultrasonic transducer array for imaging, measurement or non-destructive testing by providing or depositing a layer of piezoelectric material on a substrate comprising a metal foil; wherein the layer of the piezoelectric material has a thickness in a range of 2 µm to 20 µm, and the substrate has a thickness in a range of 20 µm to 200 µm, the piezoelectric material is a doped, co-deposited or alloyed piezoelectric material; and the piezoelectric material comprises:
   a doped, co-deposited or alloyed metal oxide or metal nitride, the metal oxide or metal nitride being doped, co-deposited or alloyed with vanadium or a compound thereof; or zinc oxide doped, co-deposited or alloyed with a transition metal or a compound thereof.

3. A method for producing a flexible ultrasound transducer or ultrasonic transducer array for imaging, measurement or non-destructive testing, the method comprising:
   providing or depositing a layer of piezoelectric material on a substrate comprising a metal foil; wherein the layer of the piezoelectric material has a thickness in a range of 2 µm to 20 µm, and the substrate has a thickness in a range of 20 µm to 200 µm, the piezoelectric material is a doped, co-deposited or alloyed piezoelectric material; and the piezoelectric material comprises:
   a doped, co-deposited or alloyed metal oxide or metal nitride, the metal oxide or metal nitride being doped, co-deposited or alloyed with vanadium or a compound thereof; or zinc oxide doped, co-deposited or alloyed with a transition metal or a compound thereof.

4. The method of claim 3, wherein the deposition of the layer of piezoelectric material is by sputter coating using a sputtering target that comprises a doped or alloyed material.

5. The method of claim 3, wherein the doped, co-deposited or alloyed piezoelectric material comprises a primary piezoelectric material and a dopant or further material, wherein the dopant or further material is present in the piezoelectric material and/or sputtering target at a level from 0.01 to 10% and the primary piezoelectric material is present in the layer of piezoelectric material in levels from 90% up to 99.99%.

6. The method of claim 5, wherein the dopant or further material is co-deposited with the primary piezoelectric material, wherein the dopant or further material is provided by a target or sputtering arrangement and the primary piezoelectric material is provided by a different target or sputtering arrangement.

7. The method of claim 3, wherein the sputter coating comprises using at least one of DC, pulsed DC, RF, closed field magnetron (CFM) sputtering, high power impulse magnetron sputtering (HIPIMS), or other magnetron sputtering method.

8. The method according to claim 3, wherein the substrate is provided on a rotating drum or linearly moving plate whilst the piezoelectric layer is deposited onto the substrate.

9. The method of claim 3, wherein: the layer of piezoelectric material is an ultrasound production layer configured and operable to produce ultrasound for imaging, measurement or non-destructive testing.

10. The method of claim 3, wherein the layer of piezoelectric material comprises a layer of at least one of: inorganic, polycrystalline, columnar non-polymeric piezoelectric material.

11. The method of claim 3, comprising providing a secondary layer comprising an electrically insulating dielectric material directly on, over or overlying at least part of a surface of the layer of piezoelectric material, and the secondary layer is less than 50 μm thick.

12. The method of claim 3, wherein the substrate is an electrical conductor and forms an electrical ground electrode of the piezoelectric device.

13. The method of claim 3, wherein the method comprises removing selected portions of the layer of piezoelectric material so as to expose a corresponding area of a surface of the substrate upon which the rest of the layer of piezoelectric material is disposed.

14. The method of claim 13, comprising removing or etching selected portions of the layer of piezoelectric material using acid or other suitable chemical agent.

15. The method of claim 3 comprising making an electrical connection directly to a surface of the substrate upon which the layer of piezoelectric material is disposed.

16. The method of claim 15, wherein the method comprises:
   removing selected portions of the layer of piezoelectric material so as to expose a corresponding area of a surface of the substrate upon which the rest of the layer of piezoelectric material is disposed; and
   making an electrical connection directly to the area of the substrate from which the piezoelectric material was removed.

17. The method of claim 15, wherein the electrical connection is a ground connection.

* * * * *